United States Patent [19]
Amagasaki

[11] Patent Number: 5,291,080
[45] Date of Patent: Mar. 1, 1994

[54] INTEGRATED CIRCUIT DEVICE HAVING TRISTATE INPUT BUFFER FOR REDUCING INTERNAL POWER USE

[75] Inventor: Seiichi Amagasaki, Tokyo, Japan
[73] Assignee: NEC Corporation, Tokyo, Japan
[21] Appl. No.: 994,310
[22] Filed: Dec. 21, 1992
[30] Foreign Application Priority Data
  Dec. 27, 1991 [JP] Japan .................. 3-360200
[51] Int. Cl.[5] .......................................... H03K 17/00
[52] U.S. Cl. ..................... 307/475; 307/443; 307/473
[58] Field of Search ............ 307/443, 463, 465, 473, 307/475, 243; 395/275

[56] References Cited
U.S. PATENT DOCUMENTS

| | | | |
|---|---|---|---|
| 4,703,198 | 10/1987 | Porter et al. ................ | 307/473 |
| 4,894,558 | 1/1990 | Conkle et al. ................ | 307/473 X |
| 4,987,319 | 1/1991 | Kawana ....................... | 307/465 |
| 5,017,813 | 5/1991 | Galbraith et al. ............ | 307/475 |
| 5,056,015 | 10/1991 | Baldwin et al. ............. | 395/275 X |
| 5,107,148 | 4/1992 | Millman ...................... | 307/475 X |
| 5,193,204 | 3/1993 | Qureshi et al. .............. | 395/275 X |
| 5,214,330 | 5/1993 | Okazaki ....................... | 307/443 |

Primary Examiner—David R. Hudspeth
Attorney, Agent, or Firm—Burns, Doane, Swecker & Mathis

[57] ABSTRACT

A large scale integrated circuit device includes a plurality of internal devices, an address decoding circuit, a bus control circuit, a first tristate buffer, and an output buffer. The internal devices are connected to an internal data bus and selectively perform data input/output operations. The address decoding circuit decodes an address signal from an address bus of a system to deliver an internal device select signal to one of the internal devices and an internal device select indication signal indicating that one of the internal devices is selected. The bus control circuit delivers an output control signal and an input control signal upon receiving the internal device select indication signal and one of a data write signal and a data read signal. The first tristate buffer controls data input to the internal data bus in accordance with the input control signal. The output buffer controls data output from the internal data bus in accordance with the output control signal.

3 Claims, 1 Drawing Sheet

INTEGRATED CIRCUIT DEVICE HAVING TRISTATE INPUT BUFFER FOR REDUCING INTERNAL POWER USE

BACKGROUND OF THE INVENTION

The present invention relates to a large scale integrated circuit device (LSI device) used in, e.g., an information processing apparatus and, more particularly, to an LSI device capable of reducing power consumed inside the LSI.

Conventionally, not so many schemes to reduce LSI power consumption of this type have been proposed. So all data signals operating on a system bus are applied to an LSI chip through a bidirectional buffer, and consequently internal circuits of the LSI operate even when the operations are not required inside the LSI chip. This results in unnecessary power consumption.

In the above conventional LSI design, data are wasted, for no control is performed to apply data signals operating on the system bus only when they are required inside the LSI. For this reason, power tends to be consumed inside the LSI chip in accordance with switching between high (H) and low (L) of a data signal on the system bus. This process is used in most of LSI designs. In particular, a CMOS system wastes power if an unnecessary operation is performed because the system originally consumes large power.

SUMMARY OF THE INVENTION

It is an object of the present invention to provide a large scale integrated circuit device capable of reducing power consumption.

In order to achieve the above object of the present invention, there is provided a large scale integrated circuit device comprising a plurality of internal devices, connected to an internal data bus, for selectively performing data input/output operations, an address decoding circuit for decoding an address signal from an address bus of a system to deliver an internal device select signal to one of the internal devices and an internal device select indication signal indicating that one of the internal devices is selected, a bus control circuit for delivering an output control signal and an input control signal upon receiving the internal device select indication signal and one of a data write signal and a data read signal, a first tristate buffer for controlling data input to the internal data bus in accordance with the input control signal, and an output buffer for controlling data output from the internal data bus in accordance with the output control signed.

DESCRIPTION OF THE PREFERRED EMBODIMENT

Figure 1:
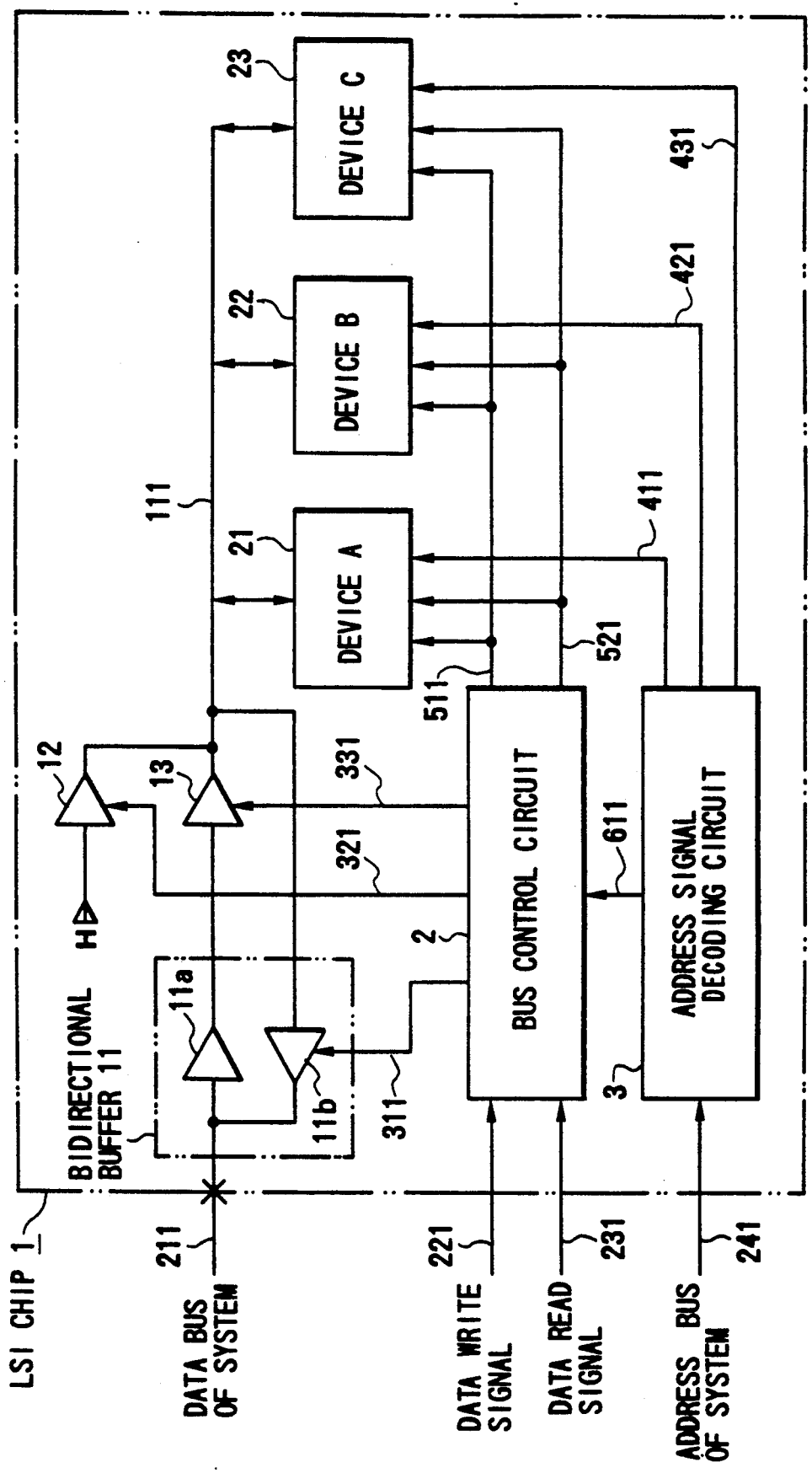
FIG. 1 is a block diagram showing the internal structure of an LSI according to an embodiment of the present invention.

An embodiment of the present invention will be described below with reference to a block diagram of FIG. 1 which shows the internal structure of an LSI. Referring to FIG. 1, reference numeral 1 denotes an LSI chip; and 3, an address signal decoding circuit. The address signal decoding circuit 3 receives an address signal from an address bus 241 of a system and delivers a device A select signal 411, a device B select signal 421, or a device C select signal 431 in accordance with the decoding condition. The address signal decoding circuit 3 also outputs an internal device select indication signal 611 when an internal device is selected. Reference numeral 2 denotes a bus control circuit which forms an input control signal 331, as a control signal for a tristate buffer 13, and an LSI internal data write signal 511 in accordance with the device select signal 611 applied from the address signal decoding circuit 3 and a data write signal 221. The bus control circuit 2 also forms an output control signal 311, as a control signal for a bidirectional buffer 11, and an LSI internal data read signal 521 in accordance with the device select indication signal 611 delivered from the address signal decoding circuit 3 and a data read signal 231. If the bus control circuit 2 outputs neither the input control signal 311 nor the output control signal 311, it delivers a pull-up control signal 321.

Reference numeral 21 denotes an LSI internal device A for delivering data to an LSI internal data bus 111 in accordance with the select signal 411 output from the address signal decoding circuit 3 and the read signal 521 output from the bus control circuit 2. The device A 21 also receives data from the LSI internal data bus 111 in accordance with the select signal 411 output from the address signal decoding circuit 3 and the write signal 511 output from the bus control circuit 2. Reference numeral 22 denotes an LSI internal device B for delivering data to the LSI internal data bus 111 in accordance with the select signal 421 output from the address signal decoding circuit 3 and the read signal 521 output from the bus control circuit 2. The device B 22 also receives data from the LSI internal data bus 111 in accordance with the select signal 421 output from the address signal decoding circuit 3 and the write signal 511 output from the bus control circuit 2. Reference numeral 23 denotes an LSI internal device C for delivering data to the LSI internal data bus 111 in accordance with the select signal 431 output from the address signal decoding circuit 3 and the read signal 521 output from the bus control circuit 2. The device C 23 also receives data from the LSI internal data bus 111 in accordance with the select signal 431 output from the address signal decoding circuit 3 and the write signal 511 output from the bus control circuit 2.

Reference numeral 11 denotes the bidirectional buffer constituted by two buffers 11a and 11b. The bidirectional buffers 11 transfers data, supplied from the devices A to C to the LSI internal data bus 111, to a data bus 211 of an external system of the LSI chip 1 in accordance with the output control signal 311 output from the bus control circuit 2. Reference numeral 12 denotes the tristate buffer for delivering a signal of high level "1" to the LSI internal data bus 111 in accordance with the pull-up control signal 321 output from the bus control circuit 2. Reference numeral 13 denotes the tristate buffer for transferring data, applied from the data bus 211 of the external system of the LSI chip 1, to the LSI internal data bus 111 through the bidirectional buffer 11 in accordance with the input control signal 331 output from the bus control circuit 2.

The bidirectional buffer 11 constituted by the input and output buffers 11a and 11b is connected between the data bus 211 of the external system and the internal data bus 111. The output terminal of the input buffer 11a is connected to the input terminal of the tristate buffer 13. The output buffer 11b is connected in reverse-parallel with a series circuit of the tristate buffer 13 and the input buffer 11a. The output terminals of the tristate buffers 13 and 12 are connected together to the internal data bus.

I/O control of this embodiment will be described in detail below by taking an operation of the device A 21 as an example.

Upon receiving an address signal for selecting the device A 21 from the address bus 241 of the system, the address signal decoding circuit 3 of the LSI chip 1 outputs the device A select signal 411 and the internal bus select indication signal 611. In accordance with the internal device select indication signal 611 from the address signal decoding circuit 3 and the data write signal 221, the bus control circuit 2 outputs the LSI internal data write signal 511 and the input control signal 311. The data from the data bus 211 of the system controls the tristate buffer 13 through the buffer 11a of the bidirectional buffer 11 such that the data is applied to the LSI internal data bus 111 through the tristate buffer 13 in accordance with the input control signal 331 as an output signal from the bus control circuit 2. The device A 21 receives data from the LSI internal data bus 111 in accordance with the LSI internal data write signal 511 output from the bus control circuit 2.

On the other hand, upon receiving an address signal for selecting the device A 21 from the address bus 241 of the system, the address signal decoding circuit 3 of the LSI chip 1 outputs the device A select signal 411 and the internal device select indication signal 611. In accordance with the internal device select indication signal 611 from the address signal decoding circuit 3 and the data read signal 231, the bus control circuit 2 outputs the LSI internal data read signal 521 and the output control signal 311.

The device A 21 delivers data to the LSI internal data bus 111 in accordance with the LSI internal data read signal 521 as an output signal from the bus control circuit 2. The data from the LSI internal data bus 111 performs control in accordance with the LSI internal data read signal 311 from the bus control circuit 2 such that the data is delivered from the LSI internal data bus 111 to the outside of the LSI chip 1 through the buffer 11b of the bidirectional buffer 11 in accordance with the input control signal 311 from the bus control circuit 2.

In situations other than the data I/O operations described above, no data is applied from the data bus 211 of the system, and no data is delivered from the devices A to C, so the LSI internal data bus 11 is floated. For this reason, in order to set the LSI internal data bus 111 at a definite level, a signal of high level "1" is applied to the LSI internal data bus 111 through the tristate buffer 12 in accordance with the pull-up control signal 321 output from the bus control circuit 2.

In this manner, control is performed such that no data enters the LSI chip from the data bus 211 of the system except when the LSI itself requires it. This consequently makes it possible to reduce unnecessary power consumption inside the LSI.

According to the present invention as has been described above, since data I/O operations for internal devices are controlled to be performed only when required, unnecessary operations inside an LSI can be eliminated. As a result, there is provided an excellent large scale integrated circuit device capable of reducing power consumption effectively, which cannot be obtained by conventional techniques.

What is claimed is:

1. A large scale integrated circuit device comprising:
   a plurality of internal devices, connected to an internal data bus, for selectively performing data input/output operations;
   an address decoding circuit for decoding an address signal from an address bus of a system to deliver an internal device select signal to one of said internal devices and an internal device select indication signal indicating that one of said internal devices is selected;
   a bus control circuit for delivering an output control signal and an input control signal upon receiving the internal device select indication signal and one of a data write signal and a data read signal;
   a first tristate buffer for controlling data input to said internal data bus in accordance with the input control signal; and
   an output buffer for controlling data output from said internal data bus in accordance with the output control signal.

2. A device according to claim 1, further comprising a second tristate buffer for pulling up said internal data bus upon receiving a pull-up control signal, and
   wherein when said bus control circuit delivers neither the input control signal nor the output control signal, said bus control circuit outputs the pull-up control signal to said second tristate buffer to pull up said internal data bus.

3. A device according to claim 1, further comprising an input buffer having an output terminal connected to an input terminal of said first tristate buffer, and
   wherein a series circuit of said first tristate buffer and said input buffer is connected in reverse-parallel with said output buffer, and output terminals of said first and second tristate buffers are connected together to said internal data bus.

* * * * *